US012802777B2

(12) United States Patent
Lu et al.

(10) Patent No.: US 12,802,777 B2
(45) Date of Patent: Nov. 17, 2026

(54) SYSTEM AND METHOD FOR MEMRISTOR CROSSBAR ARRAY NEURAL NETWORK WITH DEFECTIVE SYNAPTICS REPAIR

(71) Applicant: Logistics and Supply Chain MultiTech R&D Centre Limited, Pok Fu Lam (HK)

(72) Inventors: Feng Lu, Pok Fu Lam (HK); Xiaosheng Chen, Pok Fu Lam (HK); Jing Jung Tang, Pok Fu Lam (HK)

(73) Assignee: Logistics and Supply Chain MultiTech R&D Centre Limited, Pok Fu Lam (HK)

( * ) Notice: Subject to any disclaimer, the term of this patent is extended or adjusted under 35 U.S.C. 154(b) by 128 days.

(21) Appl. No.: 18/901,398

(22) Filed: Sep. 30, 2024

(65) Prior Publication Data

US 2026/0094663 A1 Apr. 2, 2026

(51) Int. Cl.

| | |
|---|---|
| ***G11C 29/44*** | (2006.01) |
| ***G06N 3/065*** | (2023.01) |
| ***G11C 29/00*** | (2006.01) |

(52) U.S. Cl.

CPC ........... *G11C 29/785* (2013.01); *G06N 3/065* (2023.01); *G11C 29/808* (2013.01); *G11C 29/44* (2013.01); *G11C 29/4401* (2013.01); *G11C 29/72* (2013.01)

(58) Field of Classification Search

CPC ..... G11C 29/785; G11C 29/808; G11C 11/54; G06N 3/065

See application file for complete search history.

(56) References Cited

U.S. PATENT DOCUMENTS

| | | | | |
|---|---|---|---|---|
| 2007/0276988 A1* | 11/2007 | Luo | G06F 12/0246 | 711/103 |
| 2007/0285981 A1* | 12/2007 | Roohparvar | G11C 29/808 | 365/185.09 |
| 2014/0211536 A1* | 7/2014 | Ordentlich | G11C 29/027 | 365/148 |
| 2014/0215121 A1* | 7/2014 | Ordentlich | G06F 11/1076 | 711/102 |
| 2014/0376320 A1* | 12/2014 | Loh | G11C 29/76 | 365/200 |
| 2019/0228287 A1* | 7/2019 | Okazaki | G06N 3/065 | |

(Continued)

FOREIGN PATENT DOCUMENTS

CN 111755062 10/2020

OTHER PUBLICATIONS

HK30113213A2 (System and Method for Memristor Crossbar Array Neural Network With Defective Synaptics Repair) publication with foreign office search report. (Year: 2025).*

(Continued)

*Primary Examiner* — Mushfique Siddique

(74) *Attorney, Agent, or Firm* — Renner, Kenner, Greive, Bobak, Taylor & Weber

(57) ABSTRACT

The present invention relates to a system and method for memristor crossbar array neural network with defective memristor synaptics repair. There is provided a memristor circuit comprising a primary memristor crossbar array, a redundant memristor crossbar array; and a connection switching circuit for switching inputs from the primary memristor crossbar array to the redundant memristor crossbar array when a defective memristor synaptic is detected in the primary memristor crossbar array.

23 Claims, 6 Drawing Sheets

(56) References Cited

U.S. PATENT DOCUMENTS

| | | | | |
|---|---|---|---|---|
| 2020/0096564 | A1* | 3/2020 | Ge | G11C 5/02 |
| 2020/0097209 | A1* | 3/2020 | Zhou | G06F 3/064 |
| 2020/0312406 | A1* | 10/2020 | Sharma | G11C 13/004 |
| 2021/0090678 | A1* | 3/2021 | Eun | G11C 29/42 |
| 2022/0171543 | A1* | 6/2022 | Jway | G11C 29/18 |
| 2025/0095728 | A1* | 3/2025 | Gao | G11C 13/0069 |

OTHER PUBLICATIONS

Foreign office publication (Year: 2025).*

* cited by examiner

In one page, redundant and primary synaptics arranged alternately in space

SYSTEM AND METHOD FOR MEMRISTOR CROSSBAR ARRAY NEURAL NETWORK WITH DEFECTIVE SYNAPTICS REPAIR

TECHNICAL FIELD

This invention relates to a method and system for the repair of memristor crossbar array neural network with defective memristor synaptics.

BACKGROUND

A neural network is a computational model inspired by the human brain that consists of interconnected nodes (neurons) used for learning and making predictions or classifications. Comparing with conventional hardware based on the von Neumann computing architecture, the memristor crossbar neural networks (MCNNs) consume less power, perform computations in parallel, have a high device density, can scale easily, exhibit low latency, and leverage analogue properties for efficient computations. These advantages make MCNNs suitable for energy-constrained applications, enable faster processing, accommodate large network sizes, ensure real-time responsiveness, enhance system resilience, and improve performance in artificial intelligence (AI) tasks like signal processing and pattern recognition.

Continual research and development endeavours strive to enhance the manufacturing processes and improve the reliability of memristor devices to minimize the occurrence of defective memristor synaptics. Additionally, ongoing research and development efforts aim to mitigate the effects of defective memristor synaptics and maintain the functionality of the network.

SUMMARY OF THE INVENTION

According to a first aspect of the invention, there is provided a memristor circuit comprising a primary memristor crossbar array, a redundant memristor crossbar array; and a connection switching circuit for switching inputs from the primary memristor crossbar array to the redundant memristor crossbar array when a defective memristor synaptic is detected in the primary memristor crossbar array.

In an embodiment of the first aspect, the primary memristor crossbar array is adapted to be partitioned into one or more primary memristor pages.

In an embodiment of the first aspect, the primary memristor page has multiple rows of memristor synaptics and each row of memristor synaptics is connected to an input line.

In an embodiment of the first aspect, the redundant crossbar array is adapted to be partitioned into one or more redundant memristor pages.

In an embodiment of the first aspect, the redundant memristor page has multiple rows of synaptics rows of memristor synaptics and each row of memristor synaptics is connected to an input line.

In an embodiment of the first aspect, the connection switching circuit is adapted to switch input signals from one or more input lines of the primary memristor page to input lines of the redundant memristor page.

In an embodiment of the first aspect, the connection switching circuit is adapted to control signals by controlling which output pin of the circuit is connected to its input pin through a low resistance path.

In an embodiment of the first aspect, the connection switching circuit is adapted to connect a general input line of one row in the primary page and dynamically switch input line to one row in the primary page or one of a group of rows in the redundant page.

In an embodiment of the first aspect, the connection switching circuit is adapted to provide an interface for re-programming the rows to form a logical page.

In an embodiment of the first aspect, the connection switching circuit comprises NMOS/PMOS switches and CMOS inverters.

In an embodiment of the first aspect, each memristor synaptic comprises a one-transistor-one-resistance switch (1T1R) configuration.

In an embodiment of the first aspect, each memristor synaptic comprises a two-transistor-two-resistance switch (2T2R) configuration.

In an embodiment of a second aspect of the present invention, there is provided a method for repairing memristor crossbar array neural network with defective memristor synaptics, wherein the memristor circuit comprising a primary memristor crossbar array, a redundant memristor crossbar array; and a connection switching circuit, wherein the method comprising the steps of: detecting one or more defective rows in the primary memristor crossbar array; and switching inputs from the primary memristor crossbar array to the redundant memristor crossbar array.

In an embodiment of the second aspect, the method comprises the steps of: defining a row number of the primary array to be M; a row number of the redundant array to be K, creating an always-unique set of selecting vectors that has a vector number P, and a longest vector length L, determine the always-unique set such that $P\times(K-L+1)>=M$.

In an embodiment of the second aspect, the method comprises the steps of: determining a configuration of the always-unique set of vectors, such that a first item of every vector is 1, core lengths of the vectors are the same, a digit 1 except the first one and the last one in the vectors evenly dispersed in all the inside positions.

In an embodiment of the second aspect, the method comprises the step of right-shifting all the vectors in the always-unique set by n and adding the generated vectors back to the always-unique set in sequence to generate an all-unique set, where the number n should iterate from 1 to $K-L$ and the quantity of vectors in the generated all-unique set is $P\times(K-L+1)$.

In an embodiment of the second aspect, the method comprises the step of removing some vectors from the set until the quantity of vectors equals M, or slightly adjusting P and/or K and/or L to make $P\times(K-L+1)$ equal to M if $P\times(K-L+1)$ is larger than M.

In an embodiment of the second aspect, the method comprising the step of making the rows of redundant memristor synaptics represented by each vector in the final set remappable to a row of primary memristor synaptics in sequence until every row of primary memristor synaptics is remappable to some rows of redundant memristor synaptics.

In an embodiment of the second aspect, redundant and primary memristor synaptics are arranged alternately in space.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENT

With reference to FIGS. 1 to 7, an embodiment of the present invention is illustrated. This embodiment is arranged to provide a system and method repair memristor crossbar array neural network with defective memristor synaptics.

Figure 1:
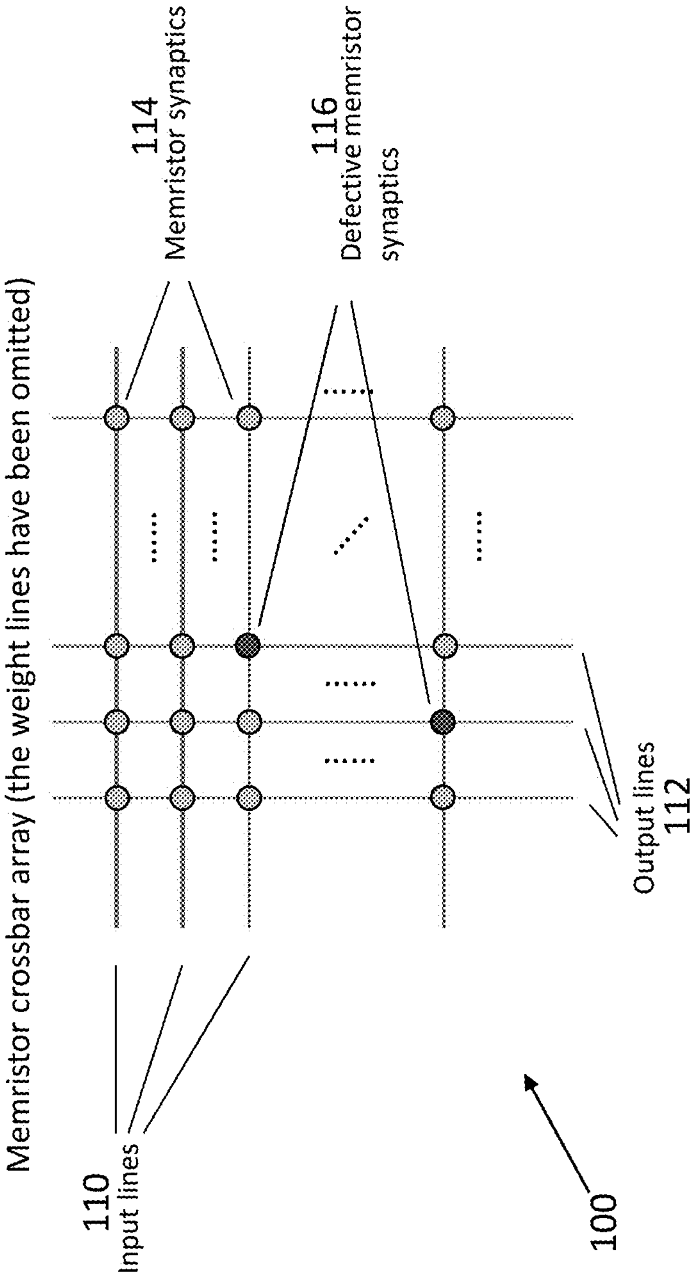
FIG. 1 is a schematic diagram of a memristor in accordance with an embodiment of the present invention.

Defective synaptics in a memristor crossbar refer to individual memristors within the crossbar array that do not function properly or exhibit performance deviations from the desired specifications. These defects can occur due to various reasons, such as manufacturing variations, material imperfections, or wear and tear over time. Defective synaptics can impact the overall performance and reliability of the memristor crossbar neural network, potentially leading to reduced accuracy, increased power consumption, or even complete system failures. Some defective synaptics defective memristor synaptics are generated during the IC manufacturing process, while others are generated during the usage process. FIG. 1 shows a memristor crossbar array of an embodiment of the present invention (the weight lines have been omitted in the drawing). In FIG. 1, the memristor 100 of an embodiment of the present invention comprises an array of memristor synaptics 114 connected to the input lines 110 and output lines 112. The memristor 100 may comprise one or more defective memristor synaptics 116. As used herein, "memristor synaptic" and "memristor synaptics" refer to one or more memristors within the memristor crossbar array that implement synaptic functions in the memristor crossbar neural network.

In one embodiment of the present invention, there is provided a memristor circuit comprising a primary memristor crossbar array, a redundant memristor crossbar array; and a connection switching circuit for switching inputs from the primary memristor crossbar array to the redundant memristor crossbar array when a defective memristor synaptic is detected in the primary memristor crossbar array.

The primary memristor crossbar array is adapted to be partitioned into one or more primary memristor pages and each of the primary memristor pages has multiple rows of memristor synaptics and each row of memristor synaptics is connected to an input line. The redundant crossbar array is adapted to be partitioned into one or more redundant memristor pages and each of the redundant memristor pages has multiple rows of memristor synaptics and each row of memristor synaptics is connected to an input line.

The connection switching circuit is adapted to switch input signals from one or more input lines of the primary memristor page to input lines of the redundant memristor page. The connection switching circuit is adapted to control signals by controlling which output pin of the circuit is connected to its input pin through a low resistance path. The connection switching circuit is adapted to connect a general input line of multiple rows in the primary page and dynamically switch input line to rows in the primary page and one or more rows in the redundant page. The connection switching circuit is adapted to provide an interface for re-programming the rows to form a logical page. The connection switching circuit is adapted to switch input signals for weight lines in the primary pages and the redundant pages. The connection switching circuit comprises NMOS/PMOS switches and CMOS inverters.

Each synaptic comprises a one-transistor-one-resistance switch (1T1R) configuration. In another embodiment, each memristor synaptic comprises a two-transistor-two-resistance switch (2T2R) configuration.

In another embodiment of the present invention, there is provided a method for repairing memristor crossbar array neural network with defective memristor synaptics, wherein the memristor circuit comprising a primary memristor crossbar array, a redundant memristor crossbar array; and a connection switching circuit, wherein the method comprising the steps of: detecting one or more rows in the primary memristor crossbar array; and switching inputs from the primary memristor crossbar array to the redundant memristor crossbar array.

The method comprises the steps of: defining a row number of the primary array to be M; a row number of the redundant array to be K, creating an always-unique set of selecting vectors that has a vector number P, and a longest vector length L, determine the always-unique set such that $P\times(K-L+1)>=M$.

The method comprises the steps of: determining a configuration of the always-unique set of vectors, such that a first item of every vector is 1, core lengths of the vectors are the same, a digit 1 except the first one and the last one in the vectors evenly dispersed in all the inside positions.

The method comprises the step of right-shifting all the vectors in the always-unique set by n and adding the generated vectors back to the always-unique set in sequence to generate an all-unique set, where the number n should iterate from 1 to K−L and the quantity of vectors in the generated all-unique set is $P\times(K-L+1)$.

The method comprises the step of removing some vectors from the set until the quantity of vectors equals M, or slightly adjusting P and/or K and/or L to make $P\times(K-L+1)$ equal to M if $P\times(K-L+1)$ is larger than M.

The method comprising the step of making the rows of redundant memristor synaptics represented by each vector in the final set remappable to a row of primary memristor synaptics in sequence until every row of primary memristor synaptics is remappable to some rows of redundant memristor synaptics.

Preferably, redundant and primary memristor synaptics are arranged alternately in space.

Research and development efforts have mainly focused on defective tolerance and improving algorithms or error-correction techniques. Intuitive and obvious ways for replacing the synaptics are not feasible because the required circuit scale and silicon area for redundant memristor synaptics and switching networks are too large to be affordable. So far, no feasible and cost-effective method has been proposed to replace the defective memristor synaptics in the memristor crossbar neural network.

In a memristor crossbar neural network, each memristor synaptic contains only a few devices. However, the number of synaptics in the network is significantly high. Therefore, it is not feasible to intuitively add switches to each memristor synaptic to disconnect and switch to a spare synaptic in case of failure due to the significant cost in terms of chip area and power consumption. Considering the defective ratio of the spare synaptics, one spare synaptic for one original synaptic is not enough, making the situation worse. Solving the issue of defective memristor synaptics in memristor crossbar neural networks with a reasonable circuit cost is a complex and challenging task.

The defective tolerance improving algorithms or error-correction techniques take more steps, time and power consumption in the massive mathematical calculation, besides, the accuracy has limitations. The method to replace defective memristor synaptics in memristor crossbar neural networks of an embodiment of the present invention would help improve the overall functionality, speed, power consumption and reliability of the network, ensuring its continued operation even in the presence of faulty elements.

The method of the present invention can be implemented in a memristor crossbar neural network circuit to repair a memristor crossbar array neural network that has defective memristor synaptics, by replacing the defective memristor synaptics with functional redundant memristor synaptics. A memristor synaptic is defective if the memristor within the array does not have the expected conductance, either being stuck at one state or exhibiting an incorrect response to conductance tuning operations.

The method of the present invention is also preferred as the remappable redundant memristor synaptics (RRC) method. Typically, a memristor crossbar array neural network has several layers, and each layer consists of a memristor crossbar array. The method of the present invention is adapted to repair a single memristor crossbar array, and this method is also adapted to be applied to each layer to repair the entire neural network.

When the memristor crossbar array to be repaired has over a predefined amount of columns or rows, then this method is adapted to partition the array into multiple pages, typically making each page have N columns or rows. Otherwise, there should be only one page and the column/row number of the page is N. The partition size can be arbitrary or optimized to have different numbers of columns or rows in different partitions or pages depending on the applications. One of the criteria for splitting the array into pages or partitions is that if the columns or rows in the array that comprise at least one defective memristor synaptic exceed a number or size, then the array would be split. That number can be an empirical number depending on the applications of the integrated circuit.

Figure 2:
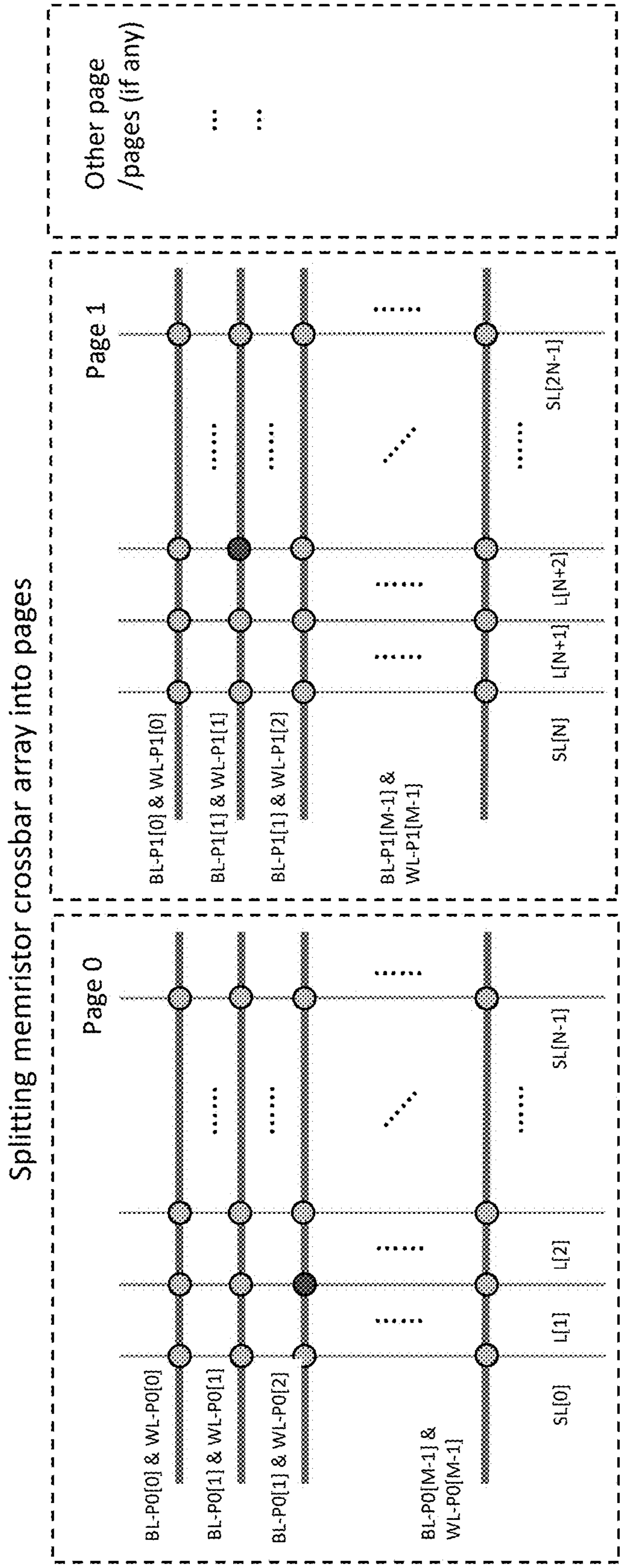
FIG. 2 is a schematic diagram of a splitting memristor with crossbar array into pages in accordance with an embodiment of the present invention.

FIG. 2 shows the method to split memristor crossbar array into pages. Each memristor synaptic has one input line and one weight line. For simplicity, the two lines are represented by one horizontal thick line in the figure. Typically, a memristor synaptic with one input line and one weight line is the 1T1R memristor synaptic shown in FIG. 3. Another typical memristor synaptic is the differential 2T2R memristor synaptic that has a pair of differential input lines and a pair of differential weight lines, as shown in FIG. 4.

Figure 3:
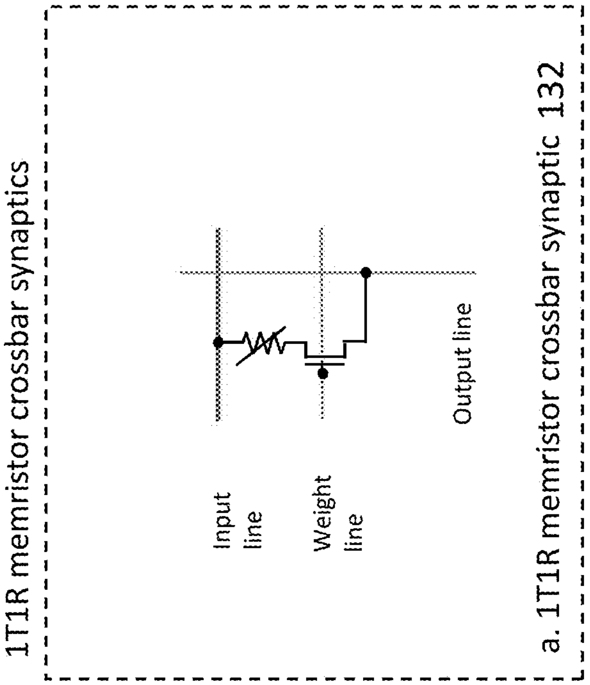
FIG. 3 is a schematic diagram of a 1T1R memristor crossbar synaptics in accordance with an embodiment of the present invention.
Figure 4:
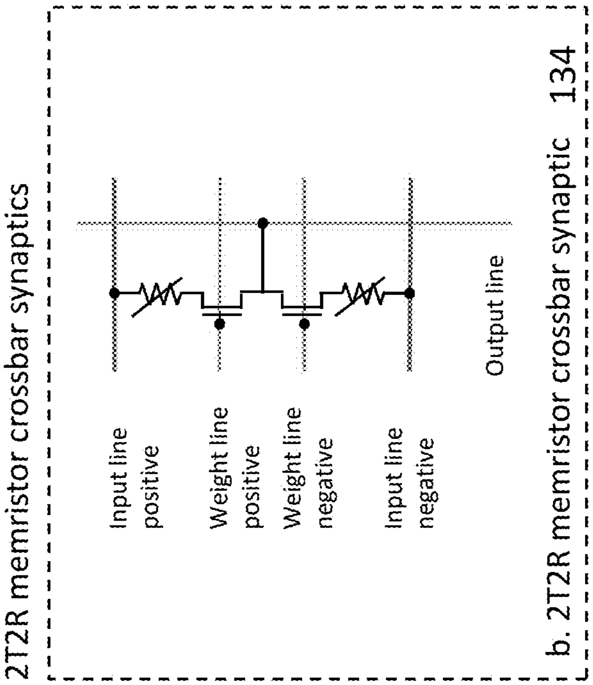
FIG. 4 is a schematic diagram of a 2T2R memristor crossbar synaptics in accordance with an embodiment of the present invention.

The method illustrated in FIGS. 3 and 4 to split a memristor crossbar array with 1T1R synaptics can be easily expanded to a memristor crossbar array with another kind of memristor synaptics that have more input line/lines and weight line/lines. Memristor synaptics with more than two input lines and more than two weight lines are uncommon.

Reference is now made to FIG. 2 which shows a memristor 100 of an embodiment of the present invention. The memristor 100 is partitioned into pages, such as page 0 122, page 1 124, etc. As shown in FIG. 2, after splitting, input lines and weight lines in different pages should be separated, e.g., input line BL-P1[0] in page 1 is separated from BL-P0[0] in page 0, weight line WL-P1[0] in page 1 is separated from WL-P0[0] in page 0. After splitting (if necessary), a row of synaptics in one page is still connected to the same weight line e.g. WLP0[0] and the same input line e.g. BLP0[0]. A row in one page is the minimum unit to check and repair.

FIG. 3 shows a schematic diagram of a 1T1R memristor crossbar synaptic 132 and FIG. 4 shows a schematic diagram of a 2T2R memristor crossbar synaptic 134 in accordance to an embodiment of the present invention.

Figure 5:
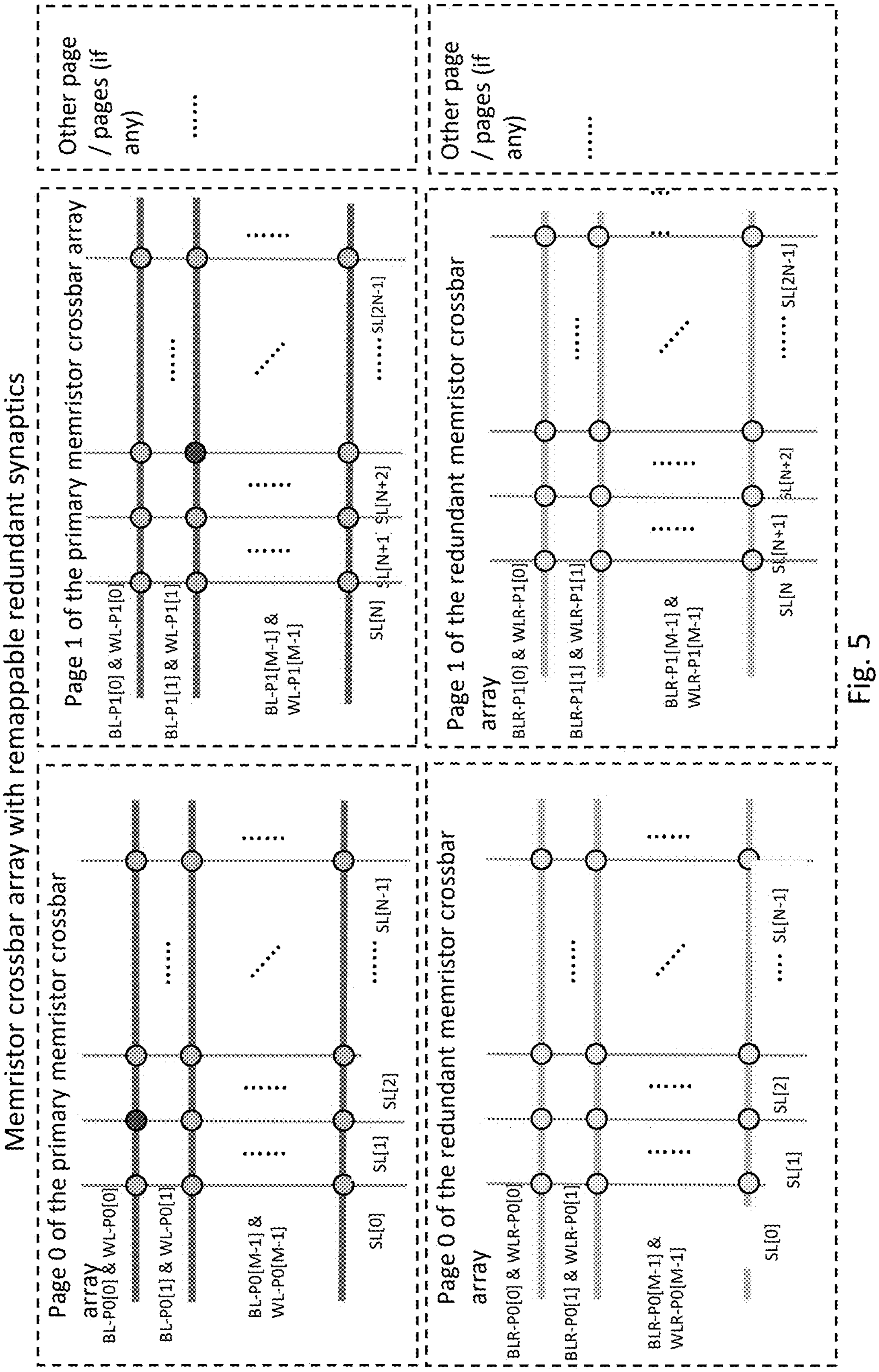
FIG. 5 is a schematic diagram of a memristor with remappable redundant memristor synaptics in the crossbar array in accordance with an embodiment of the present invention.

As shown in FIG. 5, a redundant memristor crossbar array (or redundant array for short) page that consists of redundant memristor synaptics (or redundant memristor synaptics for short) is added to each memristor crossbar array page as a backup for defective memristor synaptics. For easy distinction, the original memristor crossbar array will be called the primary memristor crossbar array (or primary array for short) and the synaptics in it called the primary memristor synaptics accordingly. The output lines in the primary array and in the redundant array are connected, so they share the same names, e.g., SL[0]. Input lines and weight lines in different redundant array pages should be separated, e.g., input line BLR-P1[0] in page 1 is separated from BLR-P0[0] in page 0, weight line WLR-P1[0] in page 1 is separated from WLR-P0[0] in page 0. A row in one redundant array page is connected to the same weight line e.g. WLR-P0[0] and the same input line e.g. BLR-P0[0].

For each page of the primary array, if a row of memristor synaptics has at least one defective memristor synaptic, this row is recognized as a defective row, and will be replaced by a redundant row in the redundant memristor crossbar array.

The method of the present invention adapted to repair a primary array page is now illustrated. In one example, the primary array page has defective memristor synaptics. The method is also applicable to other non-primary page/pages, if any.

A row of primary memristor synaptics can be remappable to a row of redundant memristor synaptics, but it's better to make each row in the primary memristor synaptics remappable to multiple rows of redundant memristor synaptics, for flexibility and robustness. For simplicity and efficiency of the remapping switching circuits, the recommended redundant memristor synaptics row quantity for each row of primary memristor synaptics is 2^n−1, where n is a positive integer and 2^n means 2 to the power of n. Although this method will require more rows of redundant memristor synaptics to remap to for a single row in the primary memristor synaptics, it is more advantageous as this method can increase remapping flexibility and system robustness. The complexity of the switching circuit increases exponentially with the growth of n. A small n such as 2 or 3 is a practical option, thus, the quantity of the redundant rows for a primary row is 3 or 7 accordingly, following the 2^n−1 rule.

The size of the redundant array can be determined according to the statistical results of the process historical data. The criteria is to make the probability high that the quantity of functional rows in the redundant array is enough to substitute the defective rows in the primary array in every page. In other words, the probability should be high that the total quantity of functional rows in both the primary array and the redundant array is larger than the row quantity of the primary array.

Considering there is a trade-off between remapping flexibility and switching circuit cost, the remapping flexibility has limitations, so not every functional row in the redundant array can be used to repair the primary array. Thus, the row quantity of the redundant array should have a little extra margin.

Figure 6:
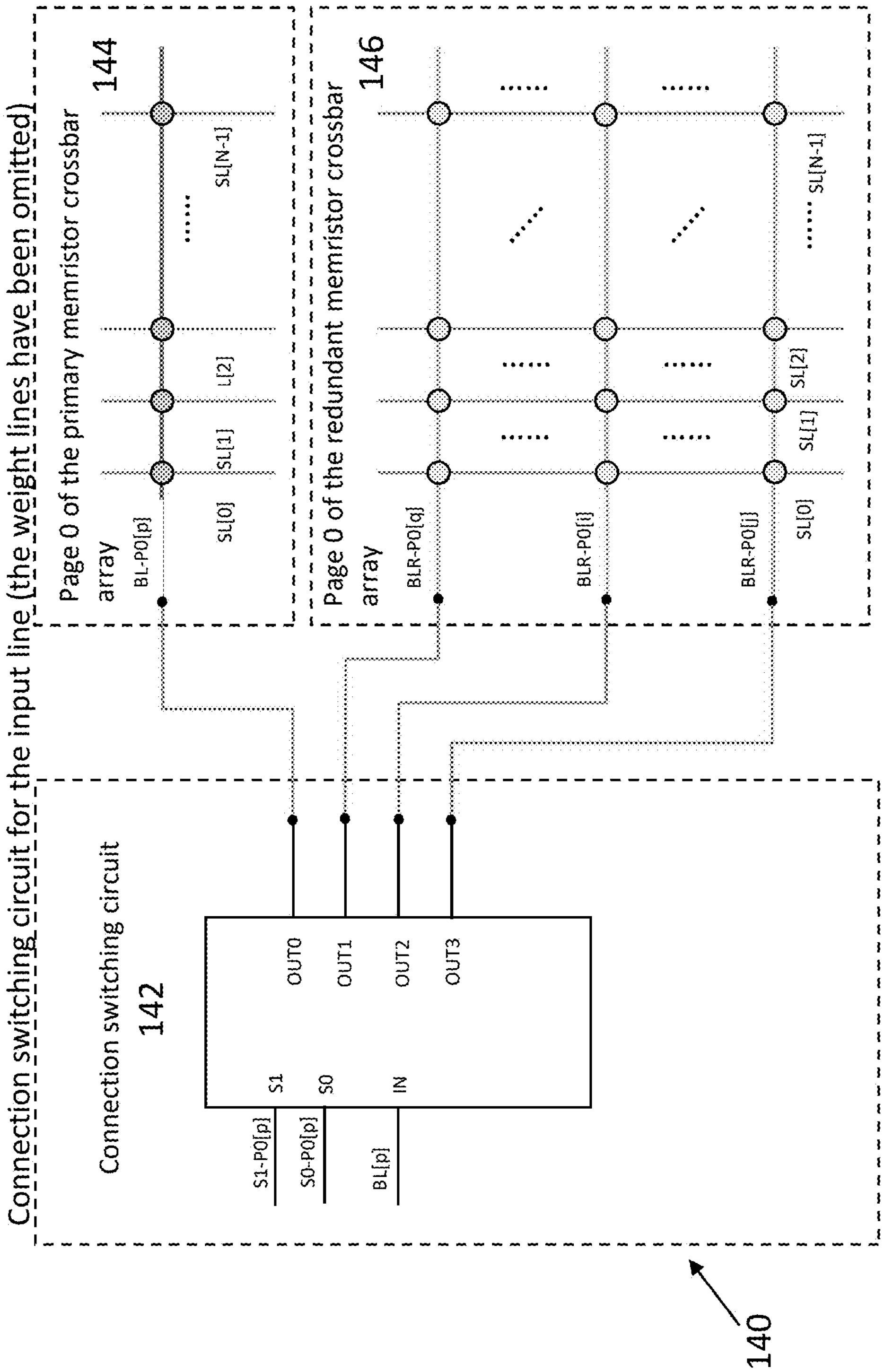
FIG. 6 is a schematic diagram of a memristor with a connection switching circuit for the input line (the weight lines have been omitted) in accordance with an embodiment of the present invention.

Reference is now made to FIG. 6 which shows a schematic diagram of a memristor with a connection switching circuit for the input line (the weight lines have been omitted) in accordance with an embodiment of the present invention.

FIG. 6 shows a memristor 140 in accordance with a preferred embodiment of the present invention comprising connection switching circuit 142 for one row in one page of the primary memristor array 144. The 1-bit digital signals S1-P0[p] and S0-P0[p] are switching control signals for row p in page 0 of the memristor array. The switching control signals control which output pin of the circuit is connected to its input pin through a low resistance path. In one embodiment, the connection switching circuit 142 can be implemented as NMOS/PMOS switches and CMOS inverters. Through the circuit 140 of an embodiment of the present invention, the general input line of row p-BL[p] can be connected to row p in page 0 of the primary array by default, while the row to connect can also be remapped to row q or row i or row j in the redundant array 144. Here p, q, i, j are variable integers, so row p could be any row in the primary array 142 and row q, i, j could be any rows in the redundant array 144. The quantity of redundant row/rows for a primary row to remap to can be increased or decreased and the quantity of the switching control signal can be dynamically rearranged automatically. In another embodiment, the circuit 140 is adapted to provide an interface for re-programming the rows to form a logical page. Although it's illustrated with page 0, it's applicable to any page. The Connection switching circuit 142 needs to be repletely applied to every row in every page of the primary array so that every row in every page of the primary array is remappable. There should be only one general input line for the rows with the same row number in all pages of a primary array.

In one embodiment of the present invention, the weight lines can also be switched with the same connection switching circuit 142 for the input lines. Similarly, the switching can be implemented dynamically. Connection switching circuits 142 for the input line and weight line for one row in one page should share the same switching control signals. For a pair of input line and weight line, the same redundant row/rows should be selected to remap to. Because the signals on the weight lines are digital signals, for the weight lines, the connection switching circuit only needs to pass the logic state of the input signal to the switched-on output port, so the connection switching circuit for the weight lines can also be realized by CMOS logic gates only.

If each memristor synaptic in the memristor array has more than 1 input lines and more than 1 weight lines, the connection switching circuit 142 could be used on each of the lines. In one preferred embodiment, the input lines and weight lines in the same row in one page are selected to remap to the same redundant row/rows.

The circuit and method of the present invention are adapted to allow the selection of rows in the redundant array to remap to every row in the primary array. This design is essential for remapping flexibility and system robustness while minimising redundant and unused synaptics arrays. The method of the present invention is adapted to handle many unwanted defective rows distributions, e.g. the defective rows excessively concentrate in a local region, the defective rows excessively concentrate in odd/even rows, etc.

The circuit and method of an embodiment of the present invention can be further clarified conceptually. For example, it is proposed to use a vector to represent a row of memristor synaptics including which row of redundant memristor synaptics to remap to which row of primary memristor synaptics.

This vector consists of a series of 1 and 0 with variable length. The vector is designed to end with 1. It is proposed to define the number of digits in the vector as the length of the vector and define the number of digits from the first 1 to the end digit in the vector as the core length of the vector. The position/positions of digit 1 in the vector represent the position/positions of rows of redundant memristor synaptics that are used to remap to a row in the primary array. E.g., {0,1,0,1,0,1} is a legal selecting vector, its core length is 4, and it represents that the second, fourth and sixth rows of redundant memristor synaptics are selected to remap to.

An operation of the vector is now defined and referred to as "right shift". The term "right shifting a vector by n" means adding n digit 0 in its head. E.g. shifting {0,1,0,1,0,1} by 2 generates {0,0,0,1,0,1,0,1}.

An all-unique set of selecting vectors is defined as a set of selecting vectors where every vector in this set is different from any other vector. An always-unique set is defined as a set of selecting vectors where every vector in this set is different from any other vector and right-shifting any vector cannot make it equal to another vector. It can be proved that if right-shifting the vectors in an always-unique set by different n and adding the generated vectors back to the set, the new set is all-unique.

Based on the previously mentioned methods, criteria, circuits and the conceptual model, the left part of the method can be represented in the following steps.

Define the row number of the primary array to be M; the row number of the redundant array to be K; and without loss of generality, M is much larger than K.

The method starts with creating an always-unique set of selecting vectors that has a vector number P, and the longest vector length L. The always-unique set should meet the following criteria otherwise more vectors should be added to the set until it's fulfilled: $P\times(K-L+1)>=M$.

A recommended configuration of the always-unique set of selecting vectors is that the first item of every vector is 1, the core lengths of the vectors are the same or almost the same, the digit 1 except the first one and the last one in the vectors evenly disperse in all the inside positions, including both odd and even positions. Increasing the core lengths of the vectors is helpful to cope with the situation that the defective rows concentratedly distribute in either the top side or the bottom side in the primary array, improving the flexibility of remapping. Any other always-unique set of selecting vectors that can be generated by right-shifting the vectors in the recommended configuration should be considered as equivalent to the recommended configuration.

Right shift all the vectors in the always-unique set by n and add the generated vectors back to the always-unique set in sequence to generate an all-unique set, where the number n should iterate from 1 to $K-L$. The quantity of vectors in the generated all-unique set is $P\times(K-L+1)$.

If P×(K−L+1) is larger than M, remove some vectors from the set until the quantity of vectors equals M, or slightly adjust P and/or K and/or L to make P×(K−L+1) equal to M.

In the first page, make the rows of redundant memristor synaptics represented by each vector in the final set remappable to a row of primary memristor synaptics in sequence until every row of primary memristor synaptics is remappable to some rows of redundant memristor synaptics.

In the other page/pages (if any), repeat the last step.

An example of the remapping method of the present invention is provided.

For a 1000×200 primary array that has 1000 rows and 200 columns, supposing when split into 2 pages, the probability is very high that at least 90% rows in each page have no defective memristor synaptics, the percentage 90% is acceptable so the page quantity 2 is determined.

Considering the redundant array's yield is almost the same as the primary array, to achieve a high probability of successfully remapping all the defective rows in the primary memristor crossbar array, according to previous criteria, there should be a total at least 1112 rows in the primary array and the redundant array. According to another previous criterion, the total row quantity is adjusted to 1120 for more margin. Hence the redundant array has 120 rows.

Trading off between reliability and circuit cost, make each row of memristor synaptics in one page of the primary memristor crossbar array remappable to 3 rows of redundant memristor synaptics.

Find an always-unique set of selecting vectors that consists of:

{1,0,0,0,0,1,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,0,0,0,0,0,1}, (the 1st)

{1,0,0,0,0,0,1,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,0,0,0,0,0,1}, (the 2nd)

{1,0,0,0,0,0,0,1,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,0,0,0,0,0,1}, (the 3rd)

. . .

{1,0,0,0,0,0,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,1,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,0,0,0,0,0,1}, (the 50th)

{1,0,0,0,0,0,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,1,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,0,0,0,0,0,1}, (the 51st)

. . .

{1,0,0,0,0,0,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,1,0,0,0,0,0,0,1}, (the 98th)

{1,0,0,0,0,0,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,1,0,0,0,0,0,1}, (the 99th)

{1,0,0,0,0,0,0,0,0,0,0,0,0,0,0,0,0,0,0,0,0,0,0,0,0,0,0,0,0,0, 0,0,0,0,0,0,0,0,0,0,0,0,0,0,0,0, 0,0,0,0,0,0,0,0,0,0,0,0,0, 0,0,0,0,0,0,0,0,0,0,0,0,0,0,0,0,0,0,0,0,0,0,0,0,0,0,0,0,0, 0,0,0,0, 0,0,0,0,0,0,0,0,0,0,0,0,0,1,0,0,0,0,1}, (the 100th)

The quantity of the vectors is 100, the core length of the vectors is 111, and the next vector is generated by shifting the second digit 1 in the previous vector by 1 except for the 50th and 51st.

Right shift all the vectors in the always-unique set by n and add the created vectors back to the always-unique set in sequence to generate an all-unique set, where the number n iterates from 1 to 9, then the quantity of vectors in the generated all-unique set is just 1000.

In the first page, make the rows of redundant memristor synaptics represented by each vector in the final set remappable to a row of primary memristor synaptics in sequence until every row of primary memristor synaptics is remappable to some rows of redundant memristor synaptics. For, the first vector means making the first, second and 71st rows of the redundant memristor synaptics remappable to the first row of the primary memristor synaptics.

In the second page, repeat the last step.

Figure 7:
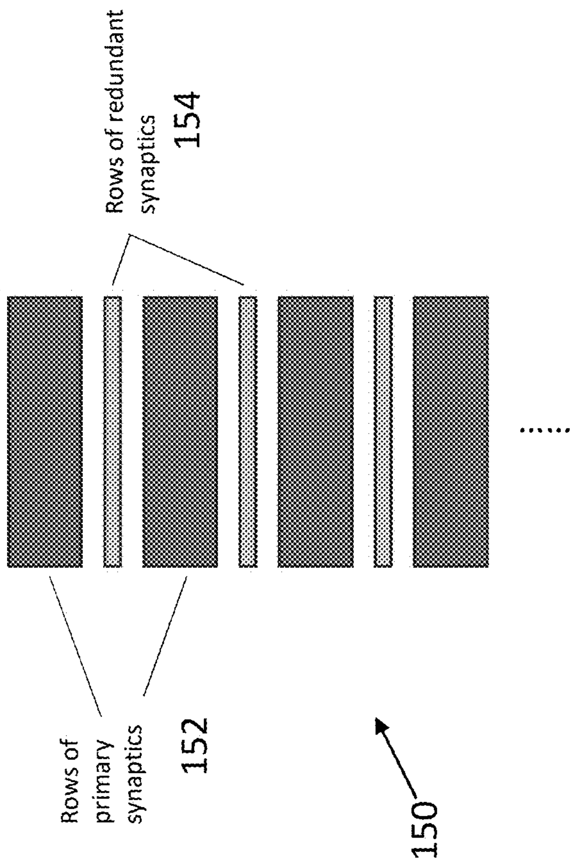
FIG. 7 is a schematic diagram representing one logical page of the memristor comprising redundant and primary memristor synaptics arranged alternately in space in accordance with an embodiment of the present invention.

It should be noted that although in FIG. 5 it looks like the redundant memristor synaptics and the primary memristor synaptics are in distinct regions, they can be arranged alternately in space in the chip as shown in FIG. 7. This is helpful to make the wires shorter in the chip.

Reference is now made to FIG. 7, there is shown a schematic diagram of the configuration of the rows of primary memristor synaptics and redundant memristor synaptics in a memristor 150. In one page, the rows of primary memristor synaptics 152 and the rows of redundant memristor synaptics 153 are arranged alternately in space in the memristor 150.

For a 2T2R memristor crossbar array, except for using the previously explained switching circuit 142 for multiple-input synaptic, a row of 2T2R memristor synaptics can also be divided into 2 rows of 1T1R memristor synaptics. Thus, a M-row 2T2R memristor crossbar array can be treat as a 2M-row 1T1R memristor crossbar array. The advantage of this method is that if only the positive part or negative part of a row of 2T2R memristor synaptics is defective, only this part itself needs to be remapped, not its counterpart.

Although the invention has been described with reference to specific examples, it will be appreciated by those skilled in the art that the invention may be embodied in many other forms, in keeping with the broad principles and the spirit of the invention described herein.

The present invention and the described preferred embodiments specifically include at least one feature that is industrial applicable.

The invention claimed is:

1. A memristor circuit comprising:

a primary memristor crossbar array including a primary memristor page, a redundant memristor crossbar array including a redundant memristor page; and a connection switching circuit for switching input signals from one or more input lines of the primary memristor page to input lines of the redundant memristor page of the redundant memristor crossbar array in response to a row of the primary memristor page having at least one defective memristor synaptic, wherein the defective memristor synaptic is a memristor that does not have an expected conductance, is stuck at one state, or exhibits an incorrect response to conductance tuning operations, and wherein the connection switching circuit is adapted to control switching of the input signals by controlling which output pin of the connection switching circuit is connected to an input pin of the connection switching circuit through a low resistance path.

2. A memristor circuit of claim 1, wherein the primary memristor crossbar array is adapted to be partitioned into one or more primary memristor pages.

3. A memristor circuit of claim 2, wherein the primary memristor page has multiple rows of memristor synaptics and each row of memristor synaptics is connected to an input line.

4. A memristor circuit of claim 3, wherein the redundant memristor crossbar array is adapted to be partitioned into one or more redundant memristor pages.

5. A memristor circuit of claim 4, wherein the redundant memristor page has multiple rows of memristor synaptics and each row of memristor synaptics is connected to an input line.

6. A memristor circuit of claim 1, wherein the connection switching circuit is adapted to connect a general input line of one row in the primary page and dynamically switch the input line to one row in the primary page or one of a group of rows in the redundant page.

7. A memristor circuit of claim 6, wherein the connection switching circuit is adapted to provide an interface for re-programming the rows to form a logical page.

8. A memristor circuit of claim 7, wherein the connection switching circuit comprises NMOS/PMOS switches and CMOS inverters.

9. A memristor circuit of claim 8, wherein each memristor synaptic comprises a one-transistor-one-resistance switch (1T1R) configuration.

10. A memristor circuit of claim 8, wherein each memristor synaptic comprises a two-transistor-two-resistance switch (2T2R) configuration.

11. The memristor circuit of claim 1, wherein the connection switching circuit is further adapted to switch signals for weight lines in the primary memristor page and the redundant memristor page.

12. The memristor circuit of claim 11, wherein the connection switching circuit for an input line and a weight line of one row in one page share the same switching control signals.

13. The memristor circuit of claim 1, wherein a quantity of redundant rows to which a primary row is remappable is increased or decreased, and a quantity of switching control signals for the primary row is dynamically rearranged automatically.

14. The memristor circuit of claim 1, wherein the connection switching circuit is adapted to allow selection of rows in the redundant memristor crossbar array to remap to every row in the primary memristor crossbar array to handle a distribution in which defective rows are concentrated in a local region or concentrated in odd rows or even rows.

15. The memristor circuit of claim 1, wherein a quantity of redundant rows for each row of primary memristor synaptics is 2^n−1, where n is a positive integer.

16. A method for repairing a memristor crossbar array neural network with defective memristor synaptics, wherein the memristor circuit comprises:

a primary memristor crossbar array including a primary memristor page, a redundant memristor crossbar array including a redundant memristor page; and a connection switching circuit adapted to control switching by controlling which output pin of the connection switching circuit is connected to an input pin of the connection switching circuit through a low resistance path, wherein the method comprises the steps of: recognizing, as a defective row, a row of memristor synaptics in the primary memristor page, wherein the defective row includes at least one defective memristor synaptic that does not have an expected conductance, is stuck at one state, or exhibits an incorrect response to conductance tuning operations; and switching input signals from one or more input lines of the primary memristor page to input lines of the redundant memristor page of the redundant memristor crossbar array using the connection switching circuit.

17. The method of claim 16, wherein the method comprises the steps of:

defining a row number of the primary array to be M; a row number of the redundant array to be K, creating an always-unique set of selecting vectors that has a vector number P, and a longest vector length L, determining the always-unique set such that P×(K−L+1) >=M.

18. The method of claim 17, wherein the method comprises the steps of determining a configuration of the always-unique set of vectors, such that a first item of every vector is 1, core lengths of the vectors are the same, a digit 1, except the first one and the last one in the vectors, is evenly dispersed in all the inside positions.

19. The method of claim 18, wherein the method comprises the step of right-shifting all the vectors in the always-unique set by n and adding the generated vectors back to the always-unique set in sequence to generate an all-unique set, where the number n should iterate from 1 to K−L and the quantity of vectors in the generated all-unique set is P×(K−L+1).

20. The method of claim 19, wherein the method comprises the step of removing some vectors from the set until the quantity of vectors equals M, or slightly adjusting P and/or K and/or L to make P×(K−L+1) equal to M if P×(K−L+1) is larger than M.

21. The method of claim 20, wherein the method comprises the step of making the rows of redundant memristor synaptics represented by each vector in the final set remappable to a row of primary memristor synaptics in sequence until every row of primary memristor synaptics is remappable to some rows of redundant memristor synaptics.

22. The method of claim 21, wherein redundant and primary memristor synaptics are arranged alternately in space.

23. The method of claim 16, wherein each memristor synaptic comprises a two-transistor-two-resistance switch configuration having a positive part and a negative part, and when only one of the positive part or the negative part is defective, only the defective positive part or defective negative part is remapped without remapping its counterpart.

* * * * *